(12) United States Patent
Kim et al.

(10) Patent No.: US 8,716,749 B2
(45) Date of Patent: May 6, 2014

(54) SUBSTRATE STRUCTURES AND METHODS OF MANUFACTURING THE SAME

(75) Inventors: Jun-youn Kim, Hwaseong-si (KR); Hyun-gi Hong, Suwon-si (KR); Young-jo Tak, Hwaseong-si (KR); Jae-won Lee, Yongin-si (KR); Hyung-su Jeong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 7 days.

(21) Appl. No.: 12/805,674

(22) Filed: Aug. 12, 2010

(65) Prior Publication Data
US 2011/0037098 A1 Feb. 17, 2011

(30) Foreign Application Priority Data

Aug. 17, 2009 (KR) .................. 10-2009-0075733

(51) Int. Cl.
*H01L 21/20* (2006.01)
(52) U.S. Cl.
USPC .................. 257/190; 438/481; 257/E21.566
(58) Field of Classification Search
USPC .................. 438/739, 481; 257/190, E21.566
See application file for complete search history.

(56) References Cited

U.S. PATENT DOCUMENTS

| 4,806,996 | A | * | 2/1989 | Luryi | 257/190 |
| 5,284,792 | A | * | 2/1994 | Forster et al. | 438/29 |
| 5,872,422 | A | | 2/1999 | Xu et al. | |
| 5,972,758 | A | * | 10/1999 | Liang | 438/294 |
| 6,261,929 | B1 | | 7/2001 | Gehrke et al. | |
| 6,265,289 | B1 | * | 7/2001 | Zheleva et al. | 438/503 |
| 6,489,221 | B2 | | 12/2002 | Gehrke et al. | |
| 6,596,377 | B1 | * | 7/2003 | Hersee et al. | 428/195.1 |
| 7,619,261 | B2 | * | 11/2009 | Koide | 257/103 |
| 2001/0025989 | A1 | * | 10/2001 | Shibuya et al. | 257/347 |
| 2001/0053618 | A1 | * | 12/2001 | Kozaki et al. | 438/933 |
| 2002/0025636 | A1 | * | 2/2002 | Ju | 438/294 |
| 2004/0115937 | A1 | * | 6/2004 | Nagai et al. | 438/689 |
| 2004/0123796 | A1 | * | 7/2004 | Nagai et al. | 117/103 |
| 2007/0072396 | A1 | * | 3/2007 | Feltin et al. | 438/478 |
| 2007/0281493 | A1 | * | 12/2007 | Fucsko et al. | 438/739 |
| 2008/0048196 | A1 | | 2/2008 | Strittmatter et al. | |

(Continued)

FOREIGN PATENT DOCUMENTS

| JP | 04-320070 | 11/1992 |
| JP | 04-320071 | 11/1992 |

(Continued)

OTHER PUBLICATIONS

Jun-Seok Ha, et al. "The Fabrication of Vertical Light-Emitting Diodes Using Chemical Lift-Off Process"; IEEE Photonics Technology Letters, vol. 20, No. 3, Feb. 1, 2008.

(Continued)

*Primary Examiner* — Steven J Fulk
(74) *Attorney, Agent, or Firm* — Harness, Dickey & Pierce, P.L.C.

(57) ABSTRACT

Substrate structures and methods of manufacturing the substrate structures. A substrate structure is manufactured by forming a protrusion area of a substrate under a buffer layer, and forming a semiconductor layer on the buffer layer, thereby separating the substrate from the buffer layer except in an area where the protrusion is formed. The semiconductor layer on the buffer layer not contacting the substrate has freestanding characteristics, and dislocation or cracks may be reduced and/or prevented.

22 Claims, 10 Drawing Sheets

(56) References Cited

U.S. PATENT DOCUMENTS

| | | | |
|---|---|---|---|
| 2008/0128716 A1* | 6/2008 | Tazima et al. | 257/88 |
| 2008/0197358 A1* | 8/2008 | Frahm et al. | 257/76 |
| 2008/0261403 A1* | 10/2008 | Wang et al. | 438/704 |
| 2008/0272462 A1 | 11/2008 | Shimamoto et al. | |
| 2009/0239361 A1* | 9/2009 | Igari et al. | 438/507 |
| 2009/0267097 A1* | 10/2009 | Tu et al. | 257/98 |

FOREIGN PATENT DOCUMENTS

| | | |
|---|---|---|
| JP | 2001-267691 A | 9/2001 |
| JP | 2002518826 A | 6/2002 |
| JP | 2002-252422 A | 9/2002 |
| JP | 2008-110895 | 5/2008 |
| JP | 2008-141057 | 6/2008 |
| KR | 10-2005-0034686 | 4/2005 |
| WO | WO 2007/001141 A1 | 1/2007 |
| WO | WO-2008103331 A2 | 8/2008 |
| WO | WO 2008103331 A3 | 8/2008 |

OTHER PUBLICATIONS

Alois Krost, Armin Dadgar "GaN-based optoelectronics on silicon substrates"; Materials Science and Engineering B93 (2002) 77-84.

F Schulze, et al. "Metalorganic vapor phase epitaxy grown InGaN/GaN light-emitting diodes on Si(001) substrate"; Applied Physics Letters 88, 121114 (2006).

A, Dadgar, et al. "Metalorganic chemical vapor phase epitaxy of gallium-nitride on silicon" Phys. Stat. Sol.; Published online Aug. 12, 2003.

European Search Report dated Nov. 20, 2012 corresponding to European Application No. 101729374.

TM Katona, "Control of crystallographic tilt in GaN grown on Si (111) by cantilever epitaxy"; Applied Physics Letters, AIP, vol. 81, No. 19, Nov. 4, 2002, pp. 3558-3560.

Chinese Office Action dated Jan. 6, 2014 in corresponding Application No. 201010256572.8.

Japanese Office Action issued Feb. 18, 2014 and its english translation.

* cited by examiner

US 8,716,749 B2

SUBSTRATE STRUCTURES AND METHODS OF MANUFACTURING THE SAME

CROSS-REFERENCE TO RELATED APPLICATION

This application claims priority under 35 U.S.C. §119 to Korean Patent Application No. 10-2009-0075733, filed on Aug. 17, 2009, in the Korean Intellectual Property Office (KIPO), the entire contents of which is incorporated herein by reference.

BACKGROUND

1. Field

Example embodiments relate to substrate structures and methods of manufacturing the same, and particularly, to substrate structures including nitride semiconductor thin films grown with a reduced dislocation density, and in which cracks are reduced and/or prevented, and methods of manufacturing the substrate structures.

2. Description of the Related Art

Light emitting diodes (LEDs) may be divided into GaN-based LEDs and white LEDs that are manufactured based on phosphors. The GaN-based LEDs are predominantly manufactured on 2-inch sapphire substrates. A method of manufacturing GaN-based LEDs on 4-inch substrates is still at an initial stage. In contrast, most semiconductor based devices may be manufactured on silicon wafers of 12 inches (300 mm) or greater in high volume production.

In order to increase LED wafer yield and to reduce LED manufacturing costs, large diameter substrates may be required. However, the use of larger diameter substrates for LED manufacture is gated by material compatibility issues. For example, when semiconductor layers are grown on large diameter sapphire substrates, the substrates may bend at high temperature due to the low thermal conductivity of sapphire. Thus it is difficult to maintain uniform thin film characteristics.

In order to reduce or eliminate substrate bending, a method of epitaxially growing a GaN LED on a silicon substrate has been suggested. Silicon substrates have higher thermal conductivity than sapphire substrates. Thus, the degree of bending of a silicon substrate which is exposed to a high GaN thin film growth temperature may be reduced and an 8-inch substrate having uniform thin film characteristics may be observed. Thus, if a high quality LED thin film may be grown in a GaN LED-on-silicon structure, the limitations of the sapphire substrate may be overcome and manufacturing costs may be reduced.

However, the use of silicon substrates poses different issues. Due to large lattice mismatch and inconformity of thermal expansion coefficients, LED semiconductor thin films grown on silicon may have high dislocation densities and cracks. In order to use current silicon substrates as LED-growing substrates, a solution to these issues may be required.

SUMMARY

Example embodiments may provide substrate structures supporting nitride semiconductor thin films (e.g., a GaN thin film) in which a threading dislocation density may be reduced and cracks may be reduced and/or prevented. Example embodiments may provide methods of manufacturing the substrate structures.

According to example embodiments, a substrate structure includes: a substrate; and a buffer layer formed on the substrate in a predetermined pattern, wherein the buffer layer is supported by a substrate protrusion that is formed by etching a surface of the substrate, and a lower surface of the buffer layer not contacting the substrate protrusion is exposed to the air.

According to example embodiments, a substrate structure includes: a substrate including a substrate protrusion; and a buffer layer on the substrate protrusion, the substrate protrusion separating the buffer layer from a part of the substrate.

The substrate structure may further include a plurality of buffer layers identical to the buffer layer, and the substrate structure may further include a nitride semiconductor layer that is formed on the plurality of buffer layers by faster lateral growth than vertical growth. The substrate structure may further include a nitride semiconductor layer formed on the buffer layer to correspond to the pattern of the buffer layers. The buffer layer may have a polygonal shape such as a triangle or a square, an oval shape, or a straight plate shape. The substrate may include Si, GaN, sapphire, SiC, $LiGaO_2$, $ZrB_2$, ZnO or $(Mn, Zn)FeO_4$.

The buffer layer may have a single layer structure formed of one selected from the group consisting of AlN, SiC, $Al_2O_3$, AlGaN, AlInGaN, AlInBGaN, AlBGaN, GaN, and XY, or a multi-layer structure comprising a combination of these, wherein X is Ti, Cr, Zr, Hf, Nb or Ta, and Y is nitrogen (N) or boron (B, $B_2$). A thickness of the buffer layer may be from about 5 nm to about 5 µm. A width L of a chip comprising the substrate structure may be in a range of 1 µm≤L≤1.5 mm, and a width m of a portion where the substrate and the buffer layer may be separated is in a range of 0.01 L≤m≤0.49 L, and a width of the pattern is in a range from about 0.02 L to about 0.98 L. The substrate structure may further include a plurality of the buffer layers, wherein a width n between the plurality of the buffer layers is in a range of 10 nm≤n≤10 µm.

According to other example embodiments, a method of forming a substrate structure includes: forming a buffer layer on a substrate; patterning the buffer layer to expose a surface of the substrate; forming holes by etching the exposed surface of the substrate between the buffer layers; forming substrate protrusions by etching a portion of the substrate under the buffer layer so as to expose a lower portion of the buffer layer by performing an etching process to the exposed surface of the substrate through the holes; and forming a semiconductor layer on the buffer layer.

According to other example embodiments, a method of manufacturing a substrate structure includes: forming a buffer layer on a substrate; etching a pattern into the buffer layer; etching the substrate through the patterned buffer layer to form at least one substrate protrusion, the substrate protrusion separating a part of the patterned buffer layer from a part of the substrate; and forming a semiconductor layer on the buffer layer.

A width of a portion where the substrate and the buffer layer contact each other may be a smaller than a width of the buffer layer. A plurality of the buffer layers may be formed by the patterning, and the semiconductor layer may be formed as a single layer on the plurality of buffer layers. The semiconductor layer may be formed as a single layer on the plurality of buffer layers by an epitaxial lateral over growth (ELOG) process. The semiconductor layer may be respectively formed on the buffer layers by horizontal growth. The method may further include: oxidizing or nitriding a surface of the substrate or forming an AlN layer on the surface of the substrate after etching the substrate.

According to other example embodiments, an electronic device includes: a substrate including a plurality of protrusions; and a buffer layer that is formed on the plurality of protrusions and has a greater width than a width of the plurality of protrusions. The electronic device may further include a semiconductor layer formed on the buffer layer.

According to other example embodiments, an electronic device includes: a substrate including a plurality of protrusions; and a buffer layer on the plurality of protrusions, a width of the buffer layer greater than a combined width of the plurality of protrusions.

BRIEF DESCRIPTION OF THE DRAWINGS

Example embodiments will be more clearly understood from the following brief description taken in conjunction with the accompanying drawings. FIGS. 1-6D represent non-limiting, example embodiments as described herein.

FIG. 1 is a schematic view illustrating a light emitting diode (LED) substrate structure according to example embodiments;

FIGS. 6A-6D are scanning electron microscope (SEM) images of substrate structures according to example embodiments.

Figure 1:
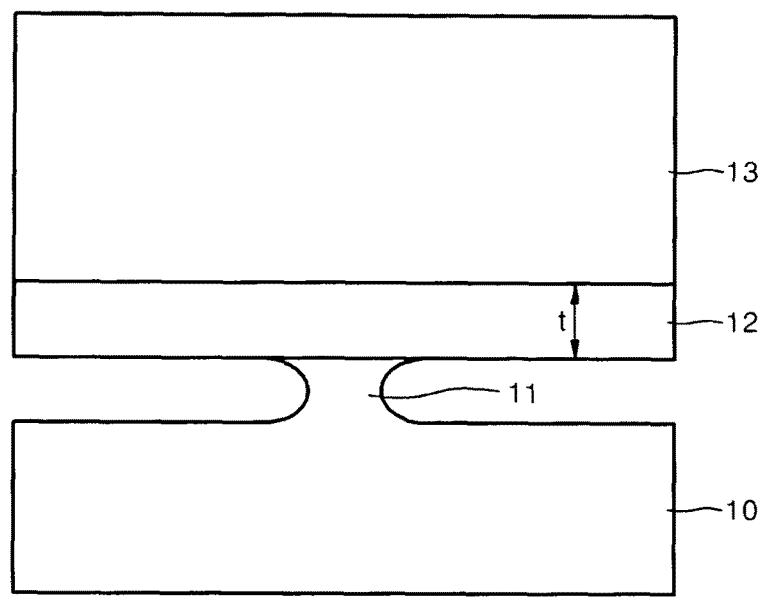

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic view illustrating a substrate structure according to example embodiments. Referring to FIG. 1, a substrate structure may include a substrate 10. The substrate 10 may include a substrate protrusion 11. A buffer layer 12 may be on the substrate 10. The buffer layer 12 may be patterned and supported by the substrate protrusion 11. A semiconductor layer 13 including, for example, a nitride semiconductor layer (e.g., a GaN-based material) may be on the buffer layer 12.

A surface of the substrate 10, except for part of a surface of the substrate protrusion 11, may be exposed (e.g., exposed to air). A lower surface of the buffer layer 12 not contacting the substrate protrusion 11 may be exposed. The substrate protrusion 11 may have a narrower width than the buffer layer 12 and may include curved side portions. A center of the substrate protrusion 11 may be narrower than ends of the substrate protrusion 11. For example, the width of the substrate protrusion 11 may increase in upward and downward directions from the center.

The buffer layer 12 may only contact the substrate 10 via the substrate protrusion 11. The semiconductor layer 13 on the buffer layer 12 may not contact the substrate 10 and may have freestanding characteristics. Strain generated due to lattice constant and thermal expansion coefficient mismatch between the substrate 10 and the semiconductor layer 13 may be reduced. As a surface area of the substrate 10 in contact with the buffer layer 12 may be limited to a surface area of the substrate protrusion 11, cracks, which may be caused due to a difference in the thermal expansion coefficients of an LED device and the semiconductor layer 13 generated when cooling the LED device from a high temperature to room temperature, may be prevented. The substrate structure illustrated in FIG. 1 may be used in, for example, an array structure as illustrated in FIG. 2A or FIG. 3A.

The substrate 10 may be, for example, a Si substrate, and may include Si(111), Si(110) and/or Si(100). The substrate 10 may be, for example, GaN, sapphire, SiC, $LiGaO_2$, $ZrB_2$, ZnO and/or $(Mn,Zn)FeO_4(111)$. The buffer layer 12 may be a single layer structure and/or a multi-layer structure including AlN, SiC, $Al_2O_3$, AlGaN, AlInGaN, AlInBGaN, AlBGaN, GaN, and/or XY, wherein X may be Ti, Cr, Zr, Hf, Nb and/or Ta, and Y may be nitrogen (N) and/or boron (B, $B_2$). A thickness t of the buffer layer 12 may be in the range of, for example, about $5 nm \leq t \leq 5 \mu m$. A substrate structure according to example embodiments may be used in various electric devices such as an electric power device (e.g., a GaN-based light emitting device or a high electron mobility transistor (HEMT) device).

Figure 2A:
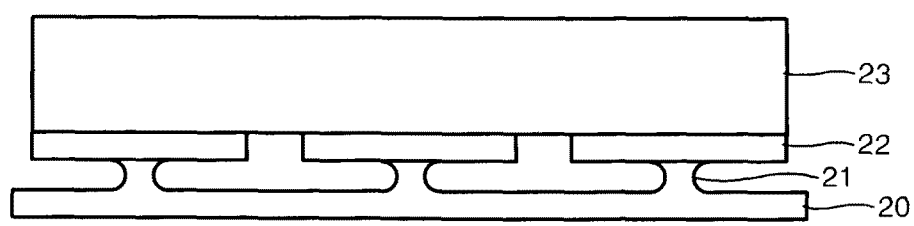
FIG. 2A is a schematic view illustrating a LED substrate structure according to example embodiments.
Figure 3A:
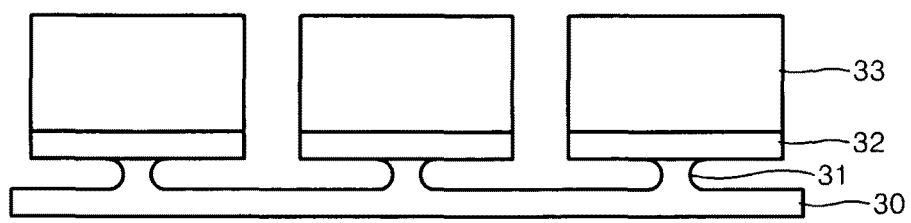
FIG. 3A is a schematic view illustrating a LED substrate structure according to example embodiments.

FIG. 2A is a schematic view illustrating a substrate structure array according to example embodiments. The substrate structure illustrated in FIG. 1 may be a single unit supporting a buffer layer and/or may be one of a plurality of substrate structures supporting one or more buffer layers. The substrate structure illustrated in FIG. 1 may be in the form of an array including a plurality of substrate structures and buffer layers in a chip without limitation. Referring to FIG. 2A, a substrate 20 may include a plurality of substrate protrusions 21. A plurality of buffer layers 22 may be on the substrate protrusions 21. A semiconductor layer 23 (e.g., a GaN-based material layer) may be on the buffer layer 22. The semiconductor layer 23 may be a nitride semiconductor layer. The semiconductor layer 23 may be, for example, a single layer structure on the plurality of buffer layers 22.

Figure 2B:
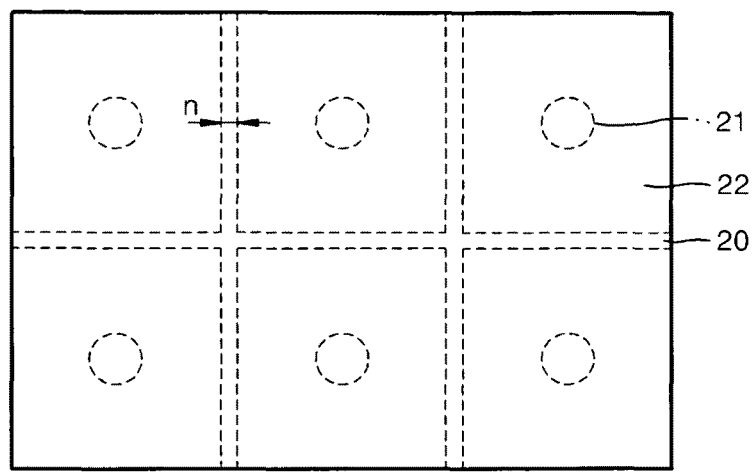
FIG. 2B is a plan view of the substrate structure of FIG. 2A.

FIG. 2B is a plan view of the substrate structure of FIG. 2A. A width n between the buffer layers 22 may be, for example, about 10 nm or greater. The buffer layers 22 in FIG. 2B may have a square form but are not limited thereto, and may have an array structure including different shapes such as a polygonal shape (e.g., a triangle and/or a square), an oval shape (e.g., a circle), and/or a straight plate shape.

Figure 2C:
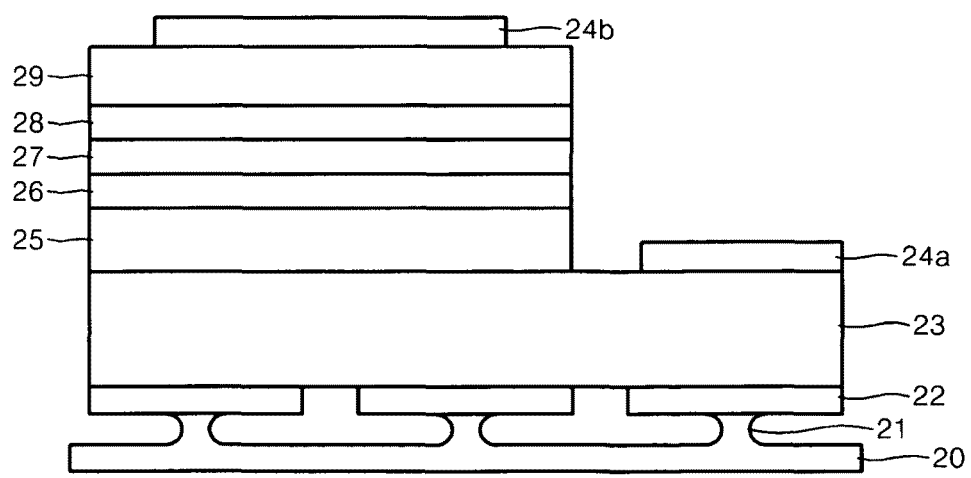
FIG. 2C is a schematic view illustrating an LED device including the substrate structure of FIG. 2A.

FIG. 2C is a schematic view illustrating an LED device including the substrate structure of FIG. 2A. Referring to FIGS. 2A and 2C, an LED structure may be on a semiconductor layer 23. A first electrode 24a may be on a portion of the semiconductor layer 23. A first clad layer 25, a first light waveguide layer 26, an active layer 27, a second light waveguide layer 28, a second clad layer 29, and/or a second electrode 24b may be stacked on a different portion of the semiconductor layer 23 than the first electrode 24a. Although a single semiconductor layer 23 is illustrated as being on a plurality of buffer layers 22, and one LED structure is illustrated on the semiconductor layer 23, example embodiments are not limited thereto. For example, a plurality of LED structures may be on the semiconductor layer 23. The substrate 20 may be removed from the LED structures.

Figure 3B:
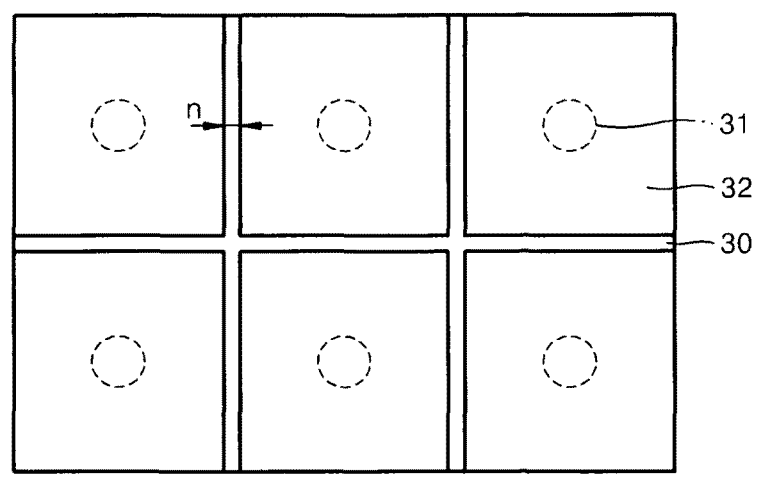
FIG. 3B is a plan view illustrating the substrate structure of FIG. 3A.

FIG. 3A is a schematic view illustrating a LED substrate structure according to example embodiments. FIG. 3A illustrates a substrate structure array including a plurality of semiconductor layers 33 corresponding to a plurality of buffer layers 32. FIG. 3B is a plan view illustrating the substrate structure of FIG. 3A. Referring to FIGS. 3A and 3B, a plurality of substrate protrusions 31 may be on a substrate 30. The buffer layers 32 may be on the substrate protrusions 31. A width n between the buffer layers 32 may be, for example, about 10 nm or greater. The buffer layers 32 of FIG. 3B may be a square shape but are not limited thereto. The buffer layers 32 may be an array structure including different shapes, such as a polygonal shape (e.g., a triangle and/or a square), an oval shape (e.g., a circle), and/or a straight plate shape.

Figure 3C:
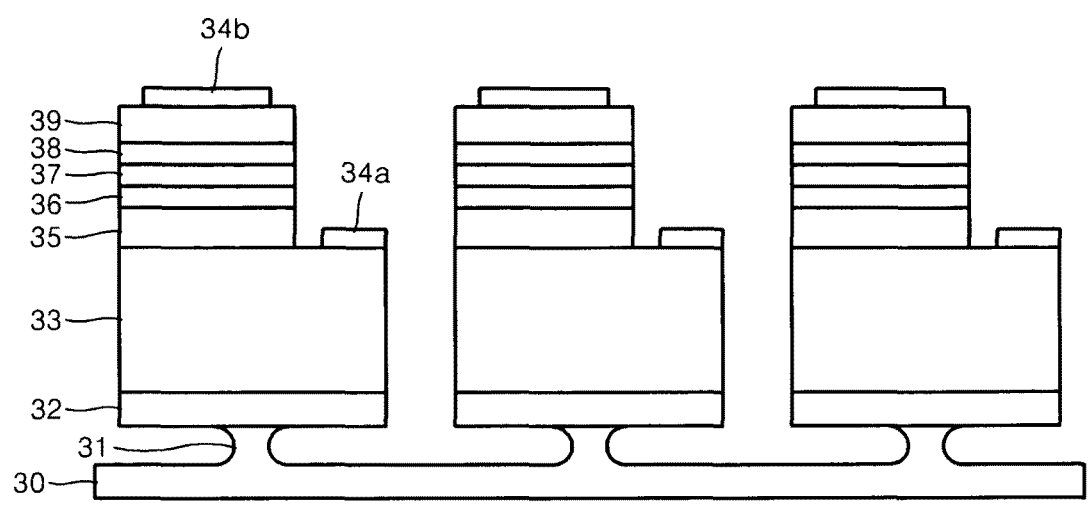
FIG. 3C is a schematic view illustrating an LED device including the substrate structure of FIG. 3A.

FIG. 3C is a schematic view illustrating an LED device including the substrate structure of FIG. 3A. Referring to FIGS. 3A and 3C, a first electrode 34a may be on a portion of each of the semiconductor layers 33. A first clad layer 35, a first light waveguide layer 36, an active layer 37, a second light waveguide layer 38, a second clad layer 39, and/or a second electrode 34b may be stacked on a different portion of each of the semiconductor layers 33 than the first electrode 34a. The substrate 30 may be removed from the LED structures.

As illustrated in FIGS. 2A and 3A, the form of the semiconductor layers 23 and 33 on the buffer layers 22 and 32, respectively, may vary, for example, according to a method of forming the same. Referring to FIG. 2A, the plurality of buffer layers 22 may be formed in one chip, but the semiconductor layer 23 thereon may have a single-layer structure due to, for example, an ELOG method. Referring to FIG. 3A, the plurality of semiconductor layers 33 may be formed on the buffer layers 32 in one chip according to, for example, a generally-used vertical growth method.

Figure 4A:
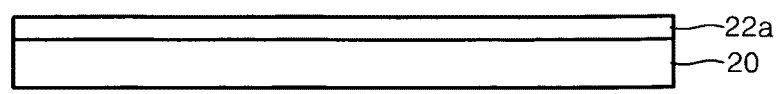
FIGS. 4A-4E illustrate methods of manufacturing the LED substrate structure of FIG. 2A according to example embodiments.

FIGS. 4A-4E illustrate methods of manufacturing the LED substrate structure of FIG. 2A according to example embodiments. Referring to FIG. 4A, a buffer layer material 22a may be coated on a substrate 20. The buffer layer material 22a may be, for example, a single layer structure including AlN, SiC, $Al_2O_3$, AlGaN, AlInGaN, AlInBGaN, AlBGaN, GaN, and/or XY, wherein X may be Ti, Cr, Zr, Hf, Nb and/or Ta, and Y may be nitrogen (N) and/or boron (B, $B_2$).

Figure 4B:
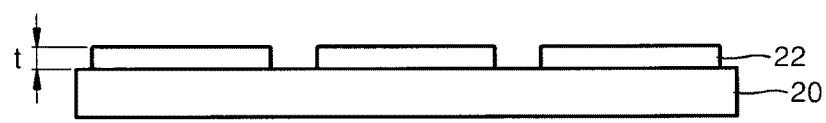
Figure 4C:
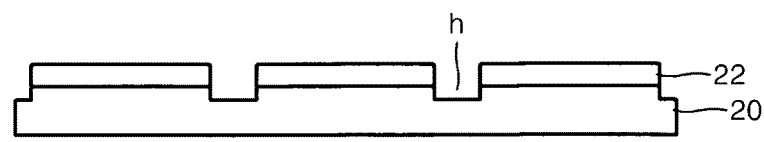
Figure 4D:
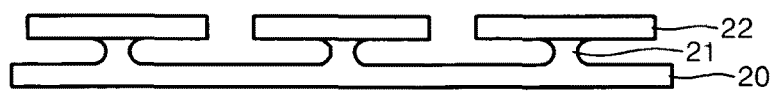

Referring to FIGS. 4B and 4C, the buffer layer material 22a may be patterned to form a plurality of buffer layers 22. The form of the buffer layers 22 may vary according to a patterning method. For example, a shape of the buffer layers 22 may be polygonal, oval, etc. A thickness t of the buffer layers 22 may be, for example, in a range of about 5 nm≤t≤5 μm. An etching process may be performed on portions of a surface of the substrate 20 that are exposed between the buffer layers 22 to form holes h. Referring to FIG. 4D, portions of the substrate 20 under the buffer layers 22 may be etched to form substrate protrusions 21 by performing, for example, a wet etch process or a dry/wet etch process on the exposed portions of the substrate 20. For example, the substrate 20 may be etched through the holes h.

By using an etch process, a surface of the substrate 20 may be etched via the holes h. The surface of the substrate 20, except for at least one surface of the substrate protrusions 21, and the lower surface of the buffer layers 22 not contacting the substrate protrusions 21, may be exposed (e.g., exposed to air). Due to the etch process, the substrate protrusions 21 may have curved side portions. A center of the substrate protrusions 21 may be narrower than ends of the substrate protrusion 11. For example, the width of the substrate protrusions 21 may increase in upward and downward directions from the center. By using the etch process, the substrate 20 and the buffer layers 22 may be separated from each other except where the substrate protrusions 21 contact the buffer layers 22. The buffer layers 22 in an area where the substrate 20 and the buffer layers 22 are separated may have freestanding characteristics. Dislocations and cracks occurring in the substrate 20 may not affect the buffer layers 22.

According to example embodiments, the substrate 20 may be etched to form the holes h in advance. In this case, a buffer layer material may be coated on the substrate 20 in which the holes h are formed. The buffer layer material may be patterned to form a plurality of the buffer layers 22, and substrate protrusions 21 may be formed through the holes h by performing, for example, a wet or dry/wet etch process to the substrate 20.

Figure 4E:
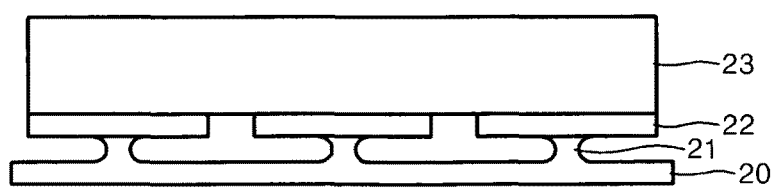

Referring to FIG. 4E, a semiconductor material (e.g., a GaN-based material) may be grown on the buffer layers 22 using, for example, an epitaxial lateral over growth (ELOG) method to form a semiconductor layer 23. According to the ELOG method lateral growth may be faster than vertical growth. A semiconductor material layer may be partially grown on each of the buffer layers 22 in a direction perpendicular to an upper surface of the buffer layers 22. By adjusting the growth direction, the semiconductor material may be grown horizontally on the upper surface of the buffer layers 22. The semiconductor material on the upper surfaces of the buffer layers 22 may be connected to one another by the lateral growth and a single semiconductor layer 23 may be formed.

If a nitride semiconductor material is directly grown on the buffer layers 22 in a metal oxide chemical vapor deposition (MOCVD) chamber, and if a Si substrate is used, melt-back etching of Si due to Ga may occur. To prevent and/or reduce melt-back etching surfaces of the substrate 20 and/or the substrate protrusions 21 may be treated according to one or more of the following example methods. Surfaces of the substrate 20 and/or the substrate protrusions 21 may be oxidized to convert the surfaces to $SiO_2$, a high temperature surface treatment using $NH_3$ may be performed on the surface of the substrate 20 and/or the substrate protrusions 21 to convert Si to a Si nitride, and/or an AlN layer may be formed on the surface of the substrate 20 and/or the substrate protrusions 21.

Figure 5A:
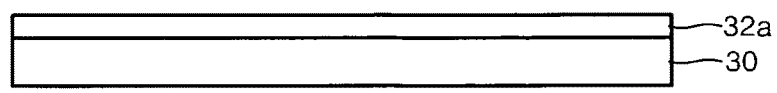
FIGS. 5A-5E illustrate methods of manufacturing the LED substrate structure of FIG. 3A.

FIGS. 5A-5E illustrate methods of manufacturing the LED substrate structure of FIG. 3A. Referring to FIG. 5A, a buffer layer material 32a may be coated on a substrate 30. The buffer layer material 32a may be, for example, a single layer structure or a multi-layer structure including AlN, SiC, $Al_2O_3$, AlGaN, AlInGaN, AlInBGaN, AlBGaN, GaN, and/or XY, wherein X may be Ti, Cr, Zr, Hf, Nb and/or Ta, and Y may be nitrogen (N) and/or boron (B, $B_2$).

Figure 5B:
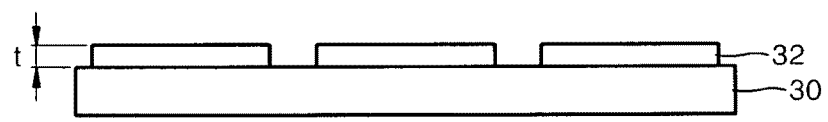
Figure 5C:
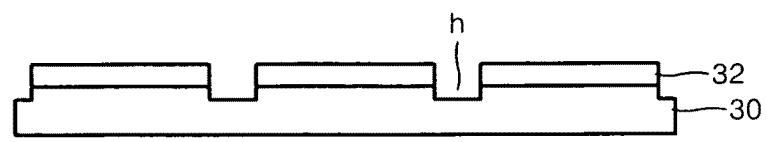
Figure 5D:
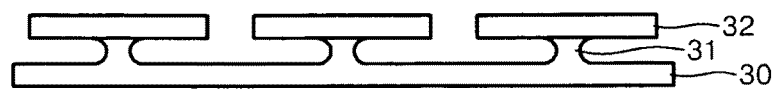

Referring to FIGS. 5B and 5C, the buffer layer material 32a may be patterned to expose portions of the substrate 30 and form a plurality of buffer layers 32. A thickness t of each of the buffer layers 32 may be in the range of about 5 nm≤t≤5 μm. Portions of an exposed surface of the substrate 30 between the buffer layers 32 may be, for example, etched to form holes h. Referring to FIG. 5D, a wet etch or dry/wet etch process, for example, may be performed on the exposed substrate 30. For example, a portion of the substrate 30 under the buffer layers 32 may be etched through the holes h to form substrate protrusions 31. The surface of the substrate 30 except for the substrate protrusion 31, and a lower surface of the buffer layer 32 not contacting the substrate protrusion 31, may be exposed (e.g., exposed to air). The substrate protrusions 31 may include curved side portions.

Figure 5E:
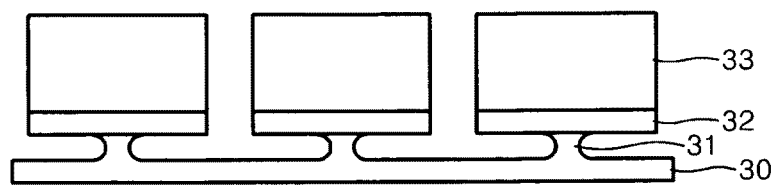

A center of the substrate protrusions 31 may be narrower than ends of the substrate protrusions 31. For example, a width of the substrate protrusions 31 may increase in upward and downward directions from the center. Except where the substrate protrusions 31 are formed, the substrate 30 and the buffer layers 32 may be separated from each other due to the etch process. The buffer layers 32 in an area where the substrate 30 and the buffer layers 32 are separated may have freestanding characteristics. Dislocations and cracks occurring in the substrate 30 may not affect the buffer layers 32. According to example embodiments, the substrate 30 may be etched to form holes h in advance of the buffer layers 32 and the substrate protrusions 31. Referring to FIG. 5E, a semiconductor material (e.g., GaN) may be grown on the buffer layers 32 to form semiconductor layers 33. The embodiment of FIG. 5E may be different from that of FIG. 4E in that the semiconductor layers 33 may be formed on the buffer layers 32 by using a deposition method in a vertical direction of the buffer layers 32 and/or the substrate 30.

When the substrate 30 is formed of Si, in order to prevent and/or reduce melt-back etching of Si due to Ga, a surface of the substrate 30 and/or the substrate protrusions 31 may be treated according to one or more of the following example methods. A surface of the substrate 30 and/or the substrate protrusions 31 may be oxidized to convert the surface to $SiO_2$, and/or a high temperature surface treatment using $NH_3$ may be performed on the surface of the substrate 30 and/or the substrate protrusions 31 to convert Si to a Si nitride, and/or an AlN layer may be formed on the surface of the substrate 30 and/or the substrate protrusions 31.

Figure 6A:
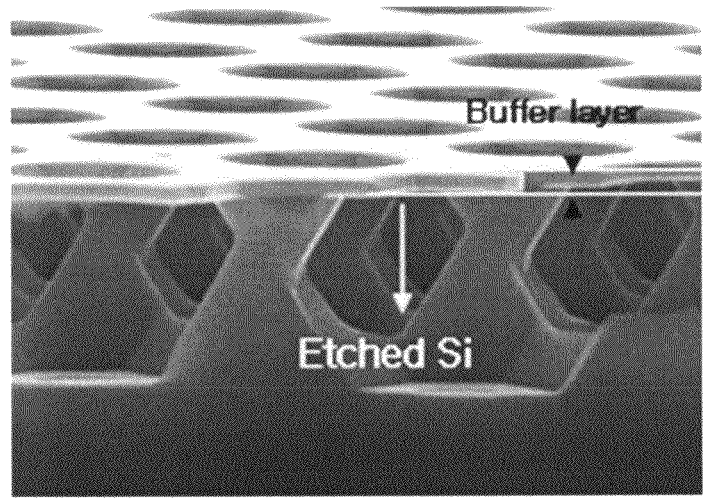
Figure 6B:
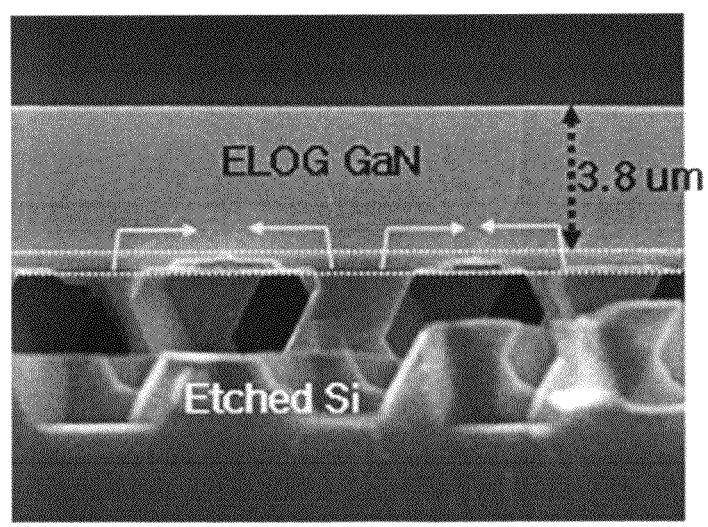
Figure 6C:
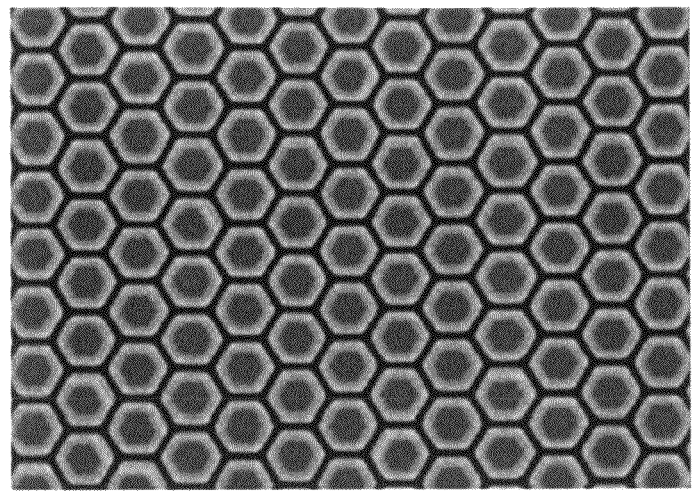

FIGS. 6A-6D are scanning electron microscope (SEM) images of substrate structures according to example embodiments. FIG. 6A may be a perspective view of a substrate structure array and FIG. 6B may be a cross-sectional view of the substrate structure array of FIG. 6A. FIG. 6C may be a plan view of a substrate structure array and FIG. 6D may be a cross-sectional view of the substrate structure array of FIG. 6C. Referring to FIGS. 6A-6D, according to a chemical wet etch process a shape of a substrate protrusion may be based on an etch rate with respect to the substrate crystal orientation (directional rates of etch) and an undercut pattern formed in a buffer layer. Different mask patterns may be used to create different undercut patterns in order to vary the shape of the protrusions.

Figure 6D:
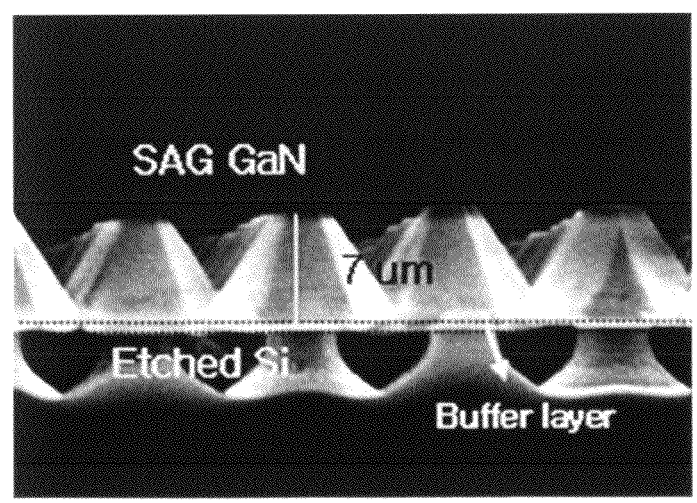

For example, FIG. 6A may illustrate circular undercut patterns formed in buffer layers that are formed over a silicon substrate with a (111) crystal orientation. The substrate structures illustrated in FIGS. 6A and 6B may be formed by etching the buffer layer and the silicon substrate through a masking layer including the circular patterns. The etch process may include an anisotropic dry etch of the buffer layer and the silicon substrate followed by an isotropic wet etch of only the silicon substrate. The masking layer may be removed and a GaN layer may be grown by ELOG. FIG. 6C may illustrate substrate structures manufactured according to the same process as described with respect to FIGS. 6A and 6B except that a hexagonal undercut pattern is used and GaN is grown according to a vertical process. FIGS. 6A and 6D may show different substrate protrusion shapes formed according to different undercut patterns. FIG. 6B may show a single semiconductor layer substrate array (e.g., similar to FIG. 2A). FIG. 6D may show a one to one correspondence between vertically grown semiconductor structures and substrate protrusions (e.g., similar to FIG. 3A).

As described above, according to the one or more of the above example embodiments, substrate structures of a semiconductor device and methods of manufacturing the substrate structures, in which a dislocation density may be reduced and generation of cracks may be reduced and/or prevented when growing a semiconductor material (e.g., a nitride based semiconductor material), may be provided.

While example embodiments have been particularly shown and described, it will be understood by one of ordinary skill in the art that variations in form and detail may be made therein without departing from the spirit and scope of the claims.

What is claimed is:

1. A substrate structure comprising:
a substrate including a plurality of substrate protrusions;
a plurality of buffer layers on the plurality of substrate protrusions respectively,
the plurality of substrate protrusions separating the plurality of buffer layers from a part of the substrate,
at least one of the plurality of substrate protrusions having a width at a center that is less than a width at ends; and
a semiconductor layer on the plurality of buffer layers, wherein
the semiconductor layer extends across the plurality of buffer layers, and
a lowermost surface of the semiconductor layer is at a height substantially equal to an uppermost surface of at least one of the plurality of buffer layers.

2. The substrate structure of claim 1,
wherein the semiconductor layer is a nitride semiconductor layer, and
the nitride semiconductor layer extends across the plurality of buffer layers.

3. The substrate structure of claim 1, wherein a shape of at least one of the plurality of buffer layers is one of polygonal, oval, and straight plate.

4. The substrate structure of claim 1, wherein the width of one of the plurality of substrate protrusions increases as a function of distance from the center.

5. The substrate structure of claim 1, wherein the substrate includes at least one of Si, GaN, sapphire, SiC, $LiGaO_2$, $ZrB_2$, ZnO and $(Mn, Zn)FeO_4$.

6. The substrate structure of claim 1, wherein the plurality of buffer layers have one of a single layer structure and a multi-layer structure,
a material of the plurality of buffer layers includes at least one of AlN, SiC, $Al_2O_3$, AlGaN, AlInGaN, AlInBGaN, AlBGaN, GaN, and XY,
X is at least one of Ti, Cr, Zr, Hf, Nb and Ta, and
Y is at least one of nitrogen (N) and boron (B, $B_2$).

7. The substrate structure of claim 1, wherein a thickness of the plurality of buffer layers is from about 5 nm to about 5 μm.

8. The substrate structure of claim 1, wherein
a width of a region separating the plurality of buffer layers is greater than about 10 nm.

9. The substrate structure of claim 1, wherein
a lowermost surface of the semiconductor layer is at a height substantially equal to an uppermost surface of at least one of the plurality of buffer layers.

10. The substrate structure of claim 1, further comprising:
an LED structure or a HEMT structure on the semiconductor layer.

11. A method of manufacturing a substrate structure, the method comprising:
forming a buffer layer material on a substrate;
etching a pattern into the buffer layer material to form a plurality of buffer layers that expose portions of the substrate;
etching the substrate through the plurality of buffer layer to form a plurality of substrate protrusions,
the plurality of substrate protrusions separating a part of the plurality of buffer layers from a part of the substrate; and
forming a semiconductor layer on the plurality of buffer layers, the semiconductor layer extends across the plurality of buffer layers, and a lowermost surface of the semiconductor layer is at a height substantially equal to an uppermost surface of at least one of the plurality of buffer layers.

12. The method of claim 11, further comprising:
forming an etch mask on the buffer layer material,
wherein the etching of the pattern into the buffer layer material includes anisotropically etching the buffer layer material through the etch mask to form the plurality of buffer layers that expose the portions of the substrate.

13. The method of claim 12, wherein the etching of the substrate through the plurality of buffer layers includes anisotropically etching the substrate to form a substrate recess and isotropically etching the substrate recess to expose a part of a lower surface of the plurality of buffer layers.

14. The method of claim 11, wherein a width of a surface of one of the plurality of substrate protrusions contacting a corresponding one of the plurality of buffer layers is smaller than a width of the corresponding one of the plurality of buffer layers.

15. The method of claim 11, wherein the etching of the pattern into the buffer layer material includes separating the buffer layer material into the plurality of buffer layers, and
the forming of the semiconductor layer includes forming the semiconductor layer as a single semiconductor layer supported by the plurality of buffer layers.

16. The method of claim 15, wherein the forming of the semiconductor layer includes forming the semiconductor layer using an epitaxial lateral over growth (FLOG) process.

17. The method of claim 11, wherein the etching of the pattern into the buffer layer material includes separating the buffer layer material into the plurality of buffer layers, and the forming of the semiconductor layer includes forming the semiconductor layer as a plurality of semiconductor layers, each of the plurality of semiconductor layers formed on a different one of the plurality of buffer layers.

18. The method of claim 17, wherein the forming of the semiconductor layer on the plurality of buffer layers includes forming the semiconductor layer using a vertical growth process.

19. The method of claim 11, further comprising:

treating exposed surfaces of the substrate and the plurality of substrate protrusions by performing at least one of an oxidization process, a nitridization process, and an AlN layer forming process.

20. An electronic device, comprising:

a substrate including a plurality of protrusions having concave side portions;

a plurality of buffer layers on the plurality of protrusions respectively, a combined width of the plurality of buffer layers being greater than a combined width of the plurality of protrusions; and a semiconductor layer on the plurality of buffer layers, a lowermost surface of the semiconductor layer being at a height substantially equal to an uppermost surface of at least one of the plurality of buffer layers, the semiconductor layer extending across the plurality of buffer layers.

21. The electronic device of claim 20, further comprising:

a semiconductor layer on the plurality of buffer layers;

a first electrode on the semiconductor layer;

a pair of cladding layers on a part of the semiconductor layer not covered by the first electrode;

an active layer between the pair of cladding layers; and a second electrode on the pair of cladding layers.

22. The electronic device of claim 20, further comprising:

an LED structure or a HEMT structure on the semiconductor layer.

\* \* \* \* \*